(12) United States Patent
Lee

(10) Patent No.: US 9,646,986 B2
(45) Date of Patent: May 9, 2017

(54) SEMICONDUCTOR MEMORY DEVICE AND METHOD OF FABRICATING THE SAME

(71) Applicant: SK hynix Inc., Gyeonggi-do (KR)

(72) Inventor: Young Jin Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 53 days.

(21) Appl. No.: 14/453,370

(22) Filed: Aug. 6, 2014

(65) Prior Publication Data

US 2015/0270281 A1    Sep. 24, 2015

(30) Foreign Application Priority Data

Mar. 21, 2014    (KR) .................. 10-2014-0033681

(51) Int. Cl.
| | |
|---|---|
| *H01L 27/11582* | (2017.01) |
| *H01L 27/11568* | (2017.01) |
| *H01L 27/115* | (2006.01) |
| *H01L 29/49* | (2006.01) |
| *H01L 29/45* | (2006.01) |
| *H01L 29/792* | (2006.01) |
| *H01L 27/1157* | (2017.01) |
| *H01L 21/02* | (2006.01) |

(52) U.S. Cl.
CPC ........ *H01L 27/11582* (2013.01); *H01L 29/45* (2013.01); *H01L 29/495* (2013.01); *H01L 29/7926* (2013.01); *H01L 21/02247* (2013.01); *H01L 21/02252* (2013.01)

(58) Field of Classification Search
CPC ....... H01L 29/49; H01L 29/45; H01L 29/788; H01L 29/7883; H01L 29/495; H01L 27/11582; H01L 27/11556; H01L 27/1157; H01L 27/11524; H01L 27/11573; H01L 27/11568; H01L 27/0688; H01L 27/1052; H01L 21/02; H01L 21/311; H01L 21/31111; H01L 21/3213; H01L 21/32133; H01L 21/0223; H01L 21/02247; H01L 21/02252; H01L 27/115; H01L 27/11531; H01L 27/1222; H01L 27/0629; H01L 27/0694; H01L 27/0922; H01L 27/11286; H01L 27/11563; H01L 27/1259; H01L 27/2436; H01L 27/2481; H01L 29/78; H01L 29/66825; H01L 21/336; H01L 21/8247
USPC ....................................... 438/278
See application file for complete search history.

(56) References Cited

U.S. PATENT DOCUMENTS

2011/0049646 A1*   3/2011   Lim ............... H01L 21/28556
                                                         257/410
2012/0146122 A1*   6/2012   Whang ............ H01L 29/7889
                                                         257/315

(Continued)

FOREIGN PATENT DOCUMENTS

| KR | 1020090113633 | 11/2009 |
| KR | 1020120121746 | 11/2012 |

*Primary Examiner* — Natalia Gondarenko
(74) *Attorney, Agent, or Firm* — IP & T Group LLP

(57) ABSTRACT

A semiconductor memory device includes insulating patterns and conductive patterns stacked alternately with each other, penetrating structures passing through the insulating patterns and the conductive patterns, and deposition suppressing layers formed on one end portions of respective interfaces between the insulating patterns and the conductive patterns.

14 Claims, 7 Drawing Sheets

(56) References Cited

U.S. PATENT DOCUMENTS

| | | | |
|---|---|---|---|
| 2013/0248974 A1* | 9/2013 | Alsmeier | G11C 16/04 257/321 |
| 2013/0302980 A1* | 11/2013 | Chandrashekar | H01L 21/76877 438/666 |
| 2014/0054675 A1* | 2/2014 | Lee | H01L 29/7926 257/324 |

* cited by examiner

SEMICONDUCTOR MEMORY DEVICE AND METHOD OF FABRICATING THE SAME

CROSS-REFERENCE TO RELATED APPLICATION

The present application claims priority to Korean patent application number 10-2014-0033681, filed on Mar. 21, 2014, the entire disclosure of which is incorporated herein in its entirety by reference.

BACKGROUND

Field of Invention

Various exemplary embodiments of the present invention relate generally to a semiconductor device and, more particularly, to a semiconductor memory device and a method of fabricating the same.

Description of Related Art

With the rapid development of semiconductor memory devices, such as non-volatile memory devices, there is an increased demand for higher degrees of integration. Conventional semiconductor memory devices, which include memory cells arranged two-dimensionally in a given area, increase the degree of integration by reducing the size of the memory cells. However, there are physical limits to how far the size of memory cells may be reduced. To overcome these physical limits, a semiconductor memory device having memory cells that are arranged three-dimensionally over a semiconductor substrate has been proposed. By arranging memory cells in three-dimensions, the area of a semiconductor memory device may be used more efficiently. In addition, the degree of integration of semiconductor memory devices having three-dimensionally arranged memory cells may be greater than that of semiconductor memory devices having two-dimensionally arranged memory cells. For example, when memory strings of a NAND flash memory device are arranged three-dimensionally, the NAND flash memory device may maximize its degree of integration. Therefore, three-dimensional semiconductor memory device technology is constantly under development.

A three-dimensional semiconductor memory device may include word lines stacked over a substrate at predetermined spacings/intervals, a channel layer passing through the word lines in a vertical direction relative to the substrate, a tunnel insulating layer surrounding the channel layer, a charge storage layer surrounding the tunnel insulating layer, and a blocking insulating layer surrounding the charge storage layer. Memory cells of the three-dimensional semiconductor memory device may store data by trapping charges in a portion of the charge storage layer arranged at an intersection between the word lines and the channel layer.

SUMMARY

Exemplary embodiments of the present invention are directed to a semiconductor memory device and a method of fabricating the same and, more particularly, to a semiconductor memory device having improved electrical characteristics through a gate electrode formed without a void and a method of fabricating the same.

A semiconductor memory device according to an embodiment of the present invention may include insulating patterns and conductive patterns stacked alternately with each other, penetrating structures passing through the insulating patterns and the conductive patterns, and deposition suppressing layers formed on one end portions of respective interfaces between the insulating patterns and the conductive patterns.

A semiconductor memory device according to an embodiment of the present invention may include insulating patterns and conductive patterns stacked alternately with each other, penetrating structures passing through the insulating patterns and the conductive patterns, a slit formed by etching the insulating patterns and the conductive patterns between the penetrating structures, and deposition suppressing layers surrounding one end portions of the insulating patterns adjacent to the slit between both end portions of the insulating patterns.

A method of fabricating a semiconductor memory device according to an embodiment of the present invention may include stacking first material layers and second material layers alternately with each other, forming holes passing through the first material layers and the second material layers, forming penetrating structures in the holes, forming trenches between the first material layers by removing the second material layers, forming deposition suppressing layers on top portions of the trenches, and forming conductive patterns by filling the trenches with a conductive material.

A method of fabricating a semiconductor memory device according to an embodiment of the present invention may include stacking first material layers and second material layers alternately with each other, forming holes passing through the first material layers and the second material layers, forming penetrating structures in the holes, forming trenches between the first material layers by removing the second material layers, forming a nucleation seed layer on surfaces of the trenches, forming deposition suppressing layers on top portions of the trenches, and forming conductive patterns in the trenches by growing the nucleation seed layer.

DETAILED DESCRIPTION

Figure 1:
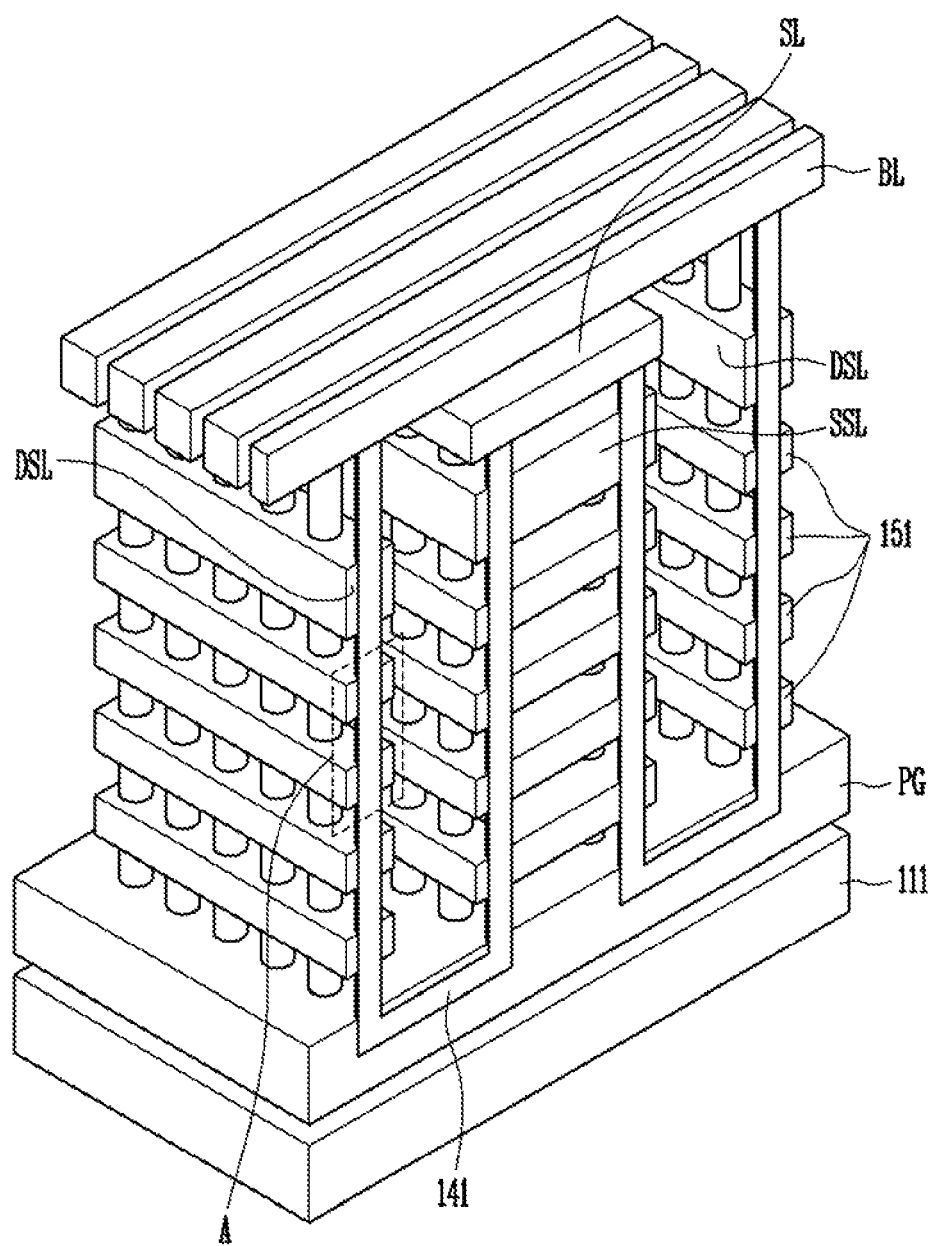
FIG. 1 is a perspective view illustrating a semiconductor device according to an embodiment of the present invention.

Hereinafter, various exemplary embodiments of the present invention will be described in detail with reference to the accompanying drawings.

This invention may, however, be embodied in different forms and should not be construed as limited to the embodiments set forth herein. Exemplary embodiments of the present invention are described below in sufficient detail to enable those of ordinary skill in the art to embody and practice the present invention.

In the drawings, thicknesses and lengths of components are exaggerated compared to the actual physical thicknesses and lengths for ease of illustration. In the following description, a detailed explanation of known related functions and constitutions may be omitted to avoid unnecessarily obscuring the subject manner. Like reference numerals refer to like elements throughout the specification and drawings.

Referring to FIG. 1, a semiconductor memory device according to an embodiment of the present invention may include a pipe gate PG, a plurality of conductive patterns 151, at least one drain selection line DSL, and at least one source selection line SSL, which are stacked over a substrate 111, and U-shaped penetrating structures 141 passing through the plurality of conductive patterns 151 and the pipe gate PG.

The plurality of conductive patterns 151, the drain selection line DSL and the source selection line SSL may be stacked while surrounding the U-shaped penetrating structures 141. In addition, the U-shaped penetrating structures 141 may be coupled to bit lines BL and a source line SL.

In the semiconductor memory device having the above-described configuration, a source selection transistor may be formed at an intersection between the source selection line SSL and the penetrating structure 141, and memory cells may be formed at intersections between the plurality of conductive patterns 151 and the penetrating structure 141. A pipe transistor may be formed at an intersection between the pipe gate PG and the penetrating structure 141, and a drain selection transistor may be formed at an intersection between the penetrating structure 141 and the drain selection line DSL.

Therefore, the drain selection transistor, a plurality of first memory cells, the pipe transistor, a plurality of second memory cells, and the source selection transistor that are coupled in series with each other may form a single string. Strings may be arranged in a U shape.

The description shows the embodiment in which the strings are arranged in a U shape. However, a semiconductor memory device including strings having a straight structure may be fabricated by forming a common source line over the semiconductor substrate 111, bit lines over the common source line, and the strings having a straight structure between the bit lines and the common source line.

Figure 2:
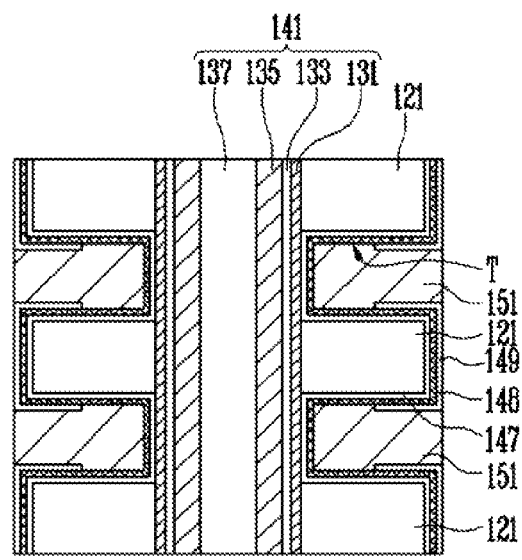
FIG. 2 is a cross-sectional view illustrating a penetrating structure by enlarging the area A shown in FIG. 1.

FIG. 2 is a cross-sectional diagram illustrating a penetrating structure by enlarging the area A shown in FIG. 1.

Referring to FIG. 2, the penetrating structure 141 may include a channel layer 135, a tunnel insulating layer 133, and a charge storage layer 131. The channel layer 135 may pass through insulating patterns 121 and conductive patterns 151 that are stacked alternately. The tunnel insulating layer 133 may surround a sidewall of the channel layer 135. The charge storage layer 131 may surround the tunnel insulating layer 133. Deposition suppressing layers 149 may be formed on surfaces of top portions of trenches T defined by the insulating patterns 121. In other words, one end of each of the insulating patterns 121, which is on the opposite side of the penetrating structure 141, may be surrounded by each of the deposition suppressing layers 149. The channel layer 135 may include a Si layer or a SiGe layer. In addition, a central axis area of the channel layer 135 may be filled with an insulating layer 137. The tunnel insulating layer 133 may include an insulating layer, such as an oxide layer. The charge storage layer 131 may include a material capable of storing charges, such as a nitride layer or a polysilicon layer. The conductive patterns 151 may include a conductive material, such as a tungsten layer, a polysilicon layer, or a silicide layer. In addition, a blocking insulating layer 147 and a barrier layer 148 may be further formed between the conductive patterns 151 and the penetrating structure 141.

As described above, since the deposition suppressing layers 149 are formed on the surfaces of the top portions of the trenches T defined by the insulating patterns 121, overhangs may be prevented from being generated at the trenches T when the conductive patterns 151 are formed by filling the trenches T with a conductive material in subsequent processes. Therefore, generation of a void in the conductive patterns 151 may be prevented.

FIGS. 3A to 3F are cross-sectional views illustrating a method of fabricating the semiconductor memory device shown in FIG. 1.

Figure 3A:
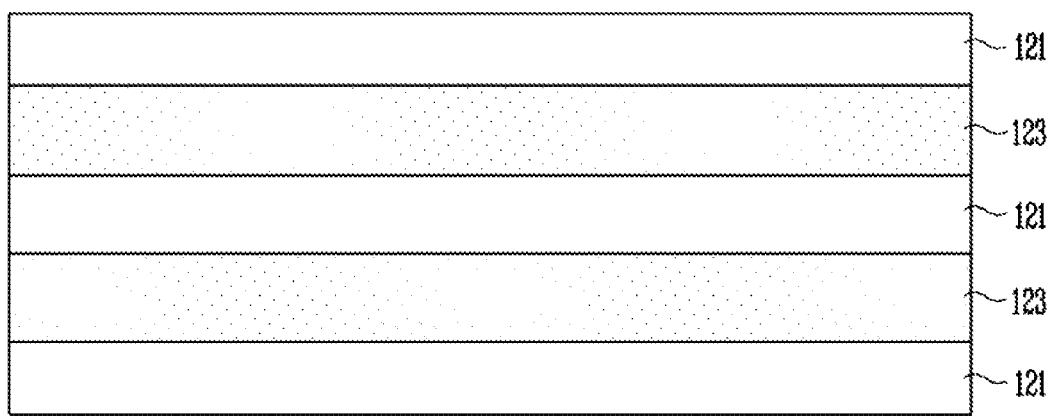
FIGS. 3A to 3F are cross-sectional views illustrating a method of fabricating the semiconductor memory device shown in FIG. 1.

Referring to FIG. 3A, a plurality of first material layers 121 and a plurality of second material layers 123 may be alternately formed over a semiconductor substrate (not illustrated). In addition, the first material layers 121 and the second material layers 123 may have the same thickness or different thicknesses from each other.

The first material layers 121 may include a material having a high etch selectivity against the second material layers 123. For example, the first material layers 121 may include an insulating layer, such as an oxide layer, and the second material layers 123 may include a sacrificial layer, such as a nitride layer. In addition, the first material layers 121 may include an insulating layer such as an oxide layer, and the second material layers 123 may include a conductive layer, such as a polysilicon layer. In addition, the first material layers 121 may include an undoped polysilicon layer, and the second material layers 123 may include a doped polysilicon layer.

Figure 3B:
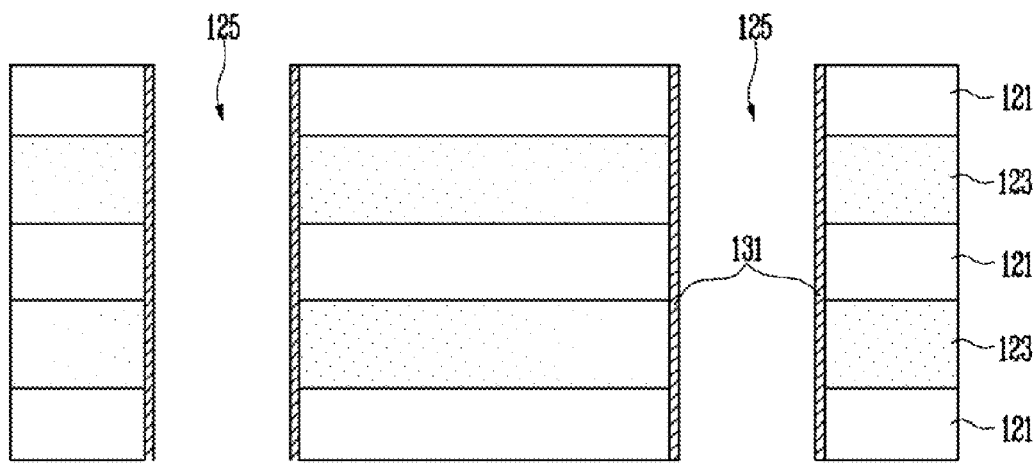

Referring to FIG. 3B, holes 125 may be formed by etching the first material layers 121 and the second material layers 123. The holes 125 may pass through the first material layers 121 and the second material layers 123. Subsequently, charge storage layers 131 may be formed along sidewalls of the holes 125. The charge storage layers 131 may include a nitride layer or a polysilicon layer.

Figure 3C:
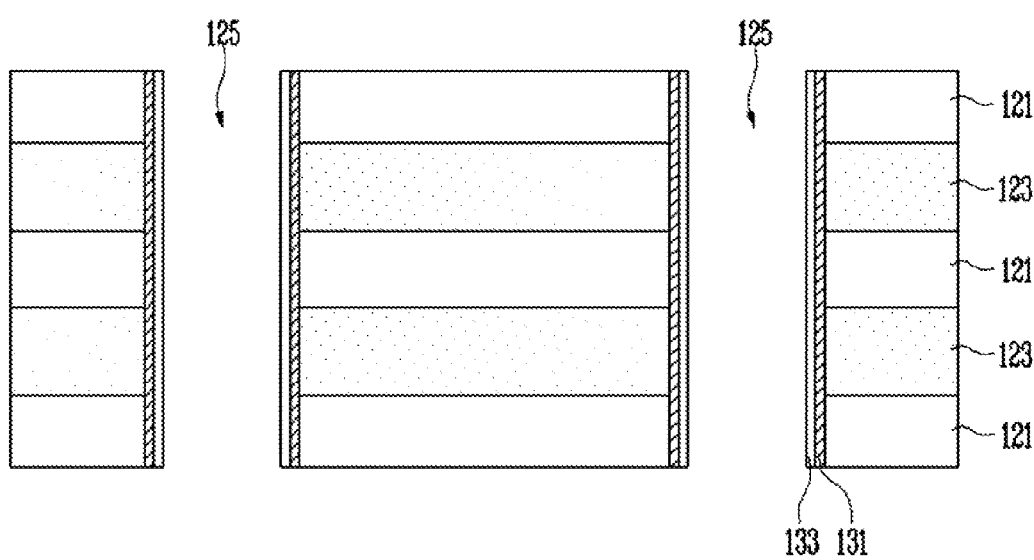

Referring to FIG. 3C, tunnel insulating layers 133 may be formed on surfaces of the charge storage layers 131. The tunnel insulating layers 133 may include an oxide layer.

Figure 3D:
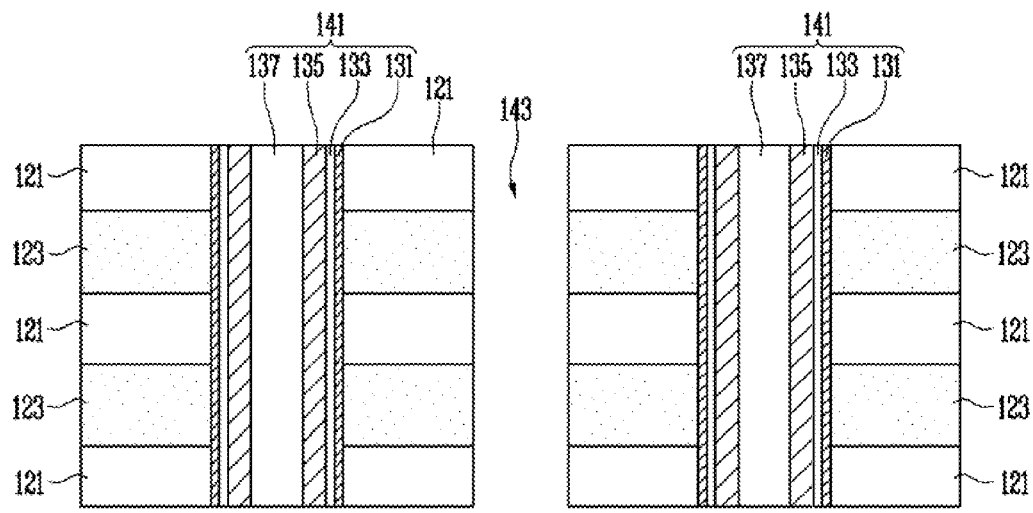

Referring to FIG. 3D, channel layers 135 may be formed on surfaces of the tunnel insulating layers 133. The channel layers 135 may include a Si layer or a SiGe layer. For example, central axis areas of the holes 125 may be filled with the channel layers 135. In another example, as shown in FIG. 3D, the channel layers 135 may have a tubular shape so that the holes may have an empty space in the central axis areas. In this example, the central axis area of the holes 125 may be filled with insulating layers 137. Each of the penetrating structures 141 may be defined by the charge storage layer 131, the tunnel insulating layer 133, the channel layer 135, and the insulating layer 137.

Subsequently, the first material layers 121 and the second material layers 123 may be etched to form a slit 143 between the holes 125. The slit 143 may pass through the first material layers 121 and the second material layers 123. Side surfaces of the second material layers 123 may be exposed through the slit 143.

Figure 3E:
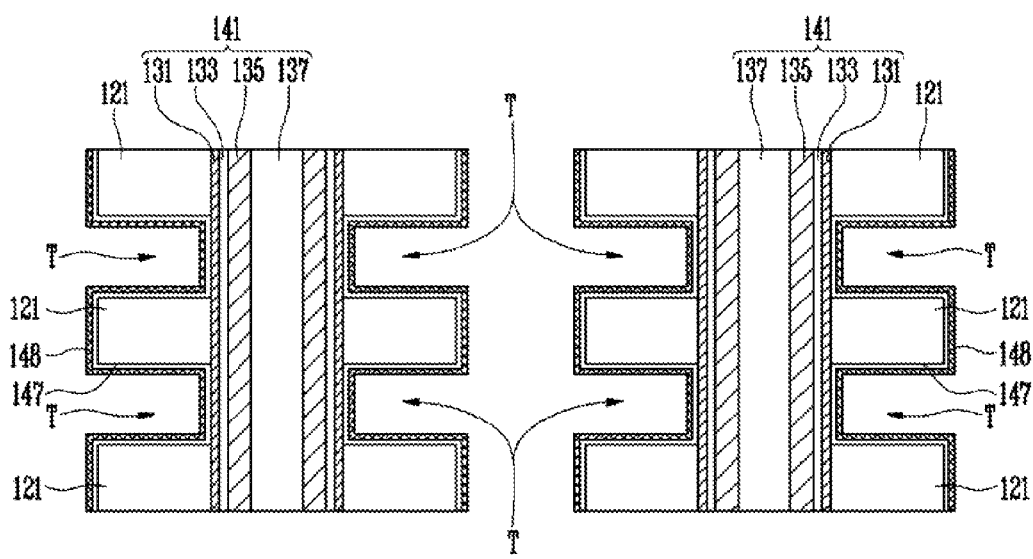

Referring to FIG. 3E, when the first material layers 121 include an insulating layer, such as an oxide layer, and the second material layers 123 include a sacrificial layer, such as a nitride layer, the second material layers 123 exposed through the slit 143 may be selectively removed to form the trenches T between the first material layers 121.

Subsequently, the blocking insulating layer 147 and the barrier layer 148 may be formed on surfaces of the trenches T from which the second material layers 123 are removed. The barrier layer 148 may include a TiN layer in order to prevent metallic diffusion of conductive layers to be filled in trenches T in subsequent processes.

Figure 3F:
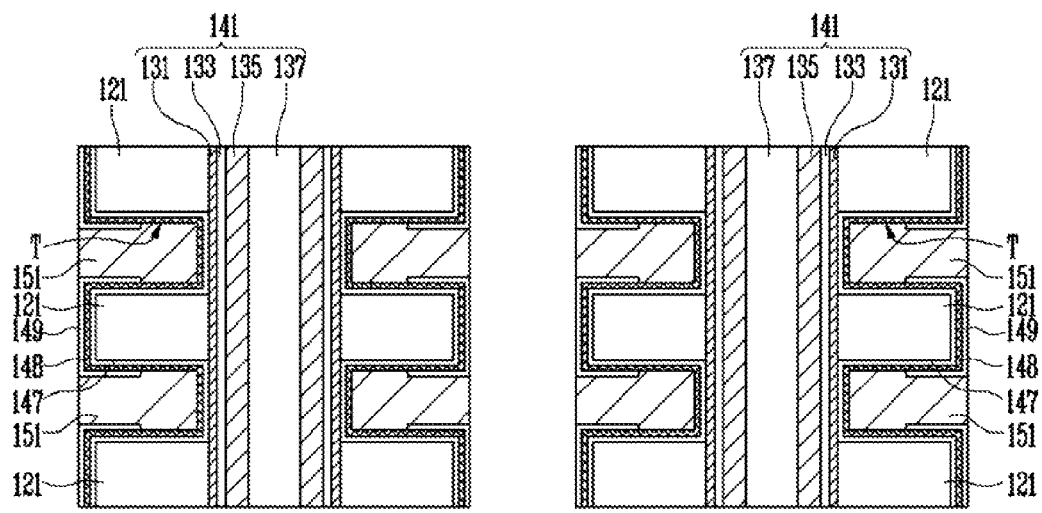

Referring to FIG. 3F, the deposition suppressing layers 149 may be formed on surfaces of top portions of the trenches T on which the blocking insulating layer 147 and the barrier layer 148 are formed. The deposition suppressing layers 149 may prevent overhangs from being formed at the surfaces of the top portions of the trenches T during the subsequent process of forming conductive layers. The deposition suppressing layers 149 may prevent deposition of the conductive layers.

The deposition suppressing layers 149 may be formed by plasma treatment. For example, the deposition suppressing layers 149 may be formed by $N_2$ plasma treatment or $O_2$ plasma treatment. When the $N_2$ plasma treatment is carried out, a thin nitride layer may be formed on the surfaces of the top portions of the trenches T. This thin nitride layer may not provide a nucleation site during the subsequent process of forming conductive patterns and may have reduced adhesive strength. As a result, overhangs may be prevented from being formed at the surfaces of the top portions of the trenches T. In substantially the same manner, when the $O_2$ plasma treatment is carried out, a thin oxide layer may be grown on the surfaces of the top portions of the trenches T. This thin oxide layer may not provide a nucleation site during the subsequent process of forming conductive patterns and may have reduced adhesive strength. As a result, overhangs may be prevented from being formed at the surfaces of the top portions of the trenches T. The above-described $N_2$ plasma treatment or $O_2$ plasma treatment may be carried out from room temperature to approximately 500° C. The deposition suppressing layers 149 may have a thickness ranging from 1 Å to 100 Å.

Subsequently, the trenches T may be filled with the conductive patterns 151. The conductive patterns 151 may be formed by filling the trenches T with conductive layers and removing the conductive layers formed in the slit. The conductive layers may be formed using a doped polysilicon layer, a metal silicide layer, a metal layer, or the like. When the conductive layer is formed using the metal layer, tungsten having low resistance may be used. Portions of the barrier layer 148 and the deposition suppressing layers 149 in the slit may also be removed when the conductive layers in the slit are removed.

Subsequently, though not illustrated in FIG. 3F, known subsequent processes, such as filling the slit with an insulating material, may be performed.

As described above, since the deposition suppressing layers 149 are formed on the surfaces of the top portions of the trenches T before the conductive patterns 151 are formed by filling the trenches T with conductive layers, deposition of the conductive layers may be relatively slowed down in the region where the deposition suppressing layers 149 are formed. Therefore, the conductive layer may be densely deposited from the lower portion of the trench. In other words, by preventing overhangs from be formed at the top portions of the trenches during the deposition of the conductive layers, voids may be prevented from being generated in the conductive patterns 151.

Figure 3G:
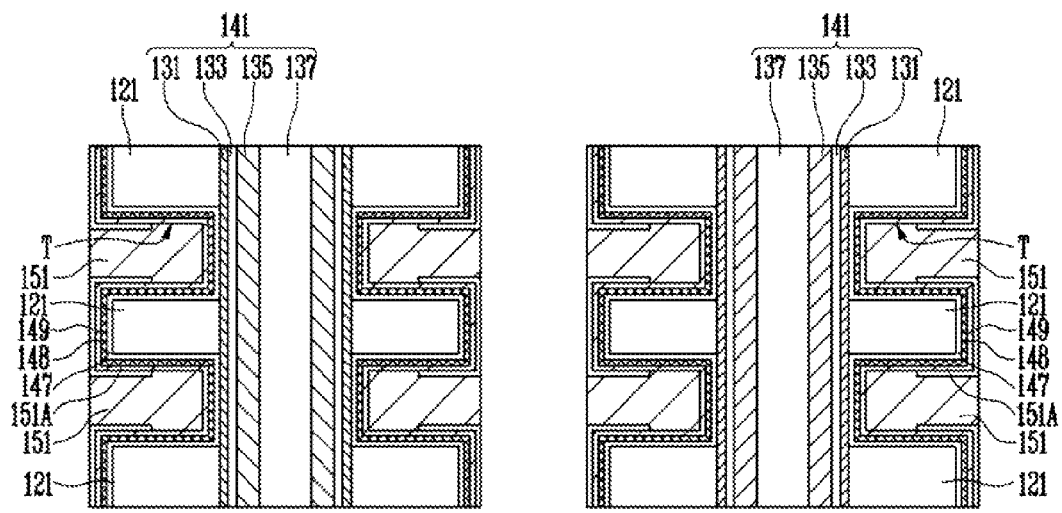
FIG. 3G is a cross-sectional view illustrating a method of fabricating a semiconductor memory device according to another embodiment of the present invention.

FIG. 3G is a cross-sectional view illustrating another embodiment of the process illustrated in FIG. 3F. Referring to FIG. 3G, after the process illustrated in FIG. 3E is completed, a nucleation seed layer 151A may be formed along the trenches T on which the blocking insulating layer 147 and the barrier layer 148 are formed. The deposition suppressing layers 149 may be formed on surfaces of top portions of the trenches T on which the nucleation seed layer 151A is formed. For example, the deposition suppressing layers 149 may be formed by $N_2$ plasma treatment or $O_2$ plasma treatment. When the $N_2$ plasma treatment is carried out, a tungsten nitride layer (WN) may be formed on a surface of the nucleation seed layer 151A formed on the top portions of the trenches T. The tungsten nitride layer (WN) may not provide a nucleation site during the subsequent process of forming conductive patterns, and may have reduced adhesive strength, so that overhangs may be prevented from being formed at the surfaces of the top portions of the trenches T.

In substantially the same manner, when the $O_2$ plasma treatment is carried out, a tungsten oxide layer (WOx) may be formed on the surface of the nucleation seed layer 151A formed on the top portions of the trenches T. The tungsten oxide layer (WOx) may not provide a nucleation site during the subsequent process of forming conductive patterns and may have reduced adhesive strength, so that overhangs may be prevented from being formed at the surfaces of the top portions of the trenches T. The $N_2$ plasma treatment or the $O_2$ plasma treatment may be performed at room temperature to approximately 500° C. The deposition suppressing layers 149 may have a thickness ranging from 1 Å to 100 Å. Subsequently, the exposed nucleation seed layer 151A may be grown to fill the trenches T with conductive layers.

Figure 4:
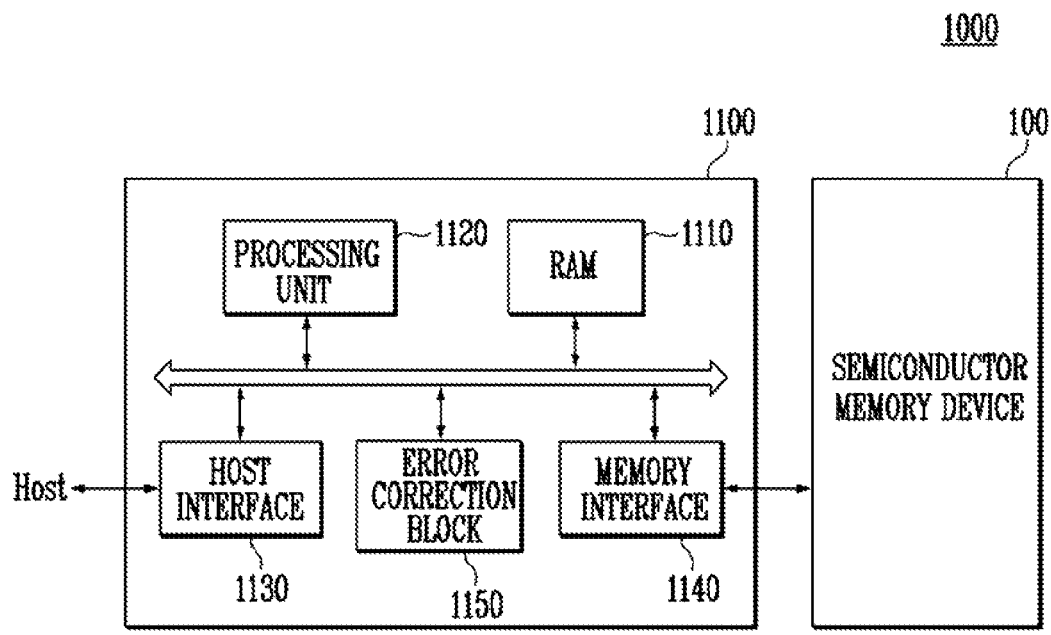
FIG. 4 is a block diagram illustrating a memory system including the semiconductor memory device shown in FIG. 1.

FIG. 4 is a block diagram illustrating a memory system including the semiconductor memory device in FIG. 1.

Referring to FIG. 4, a memory system 1000 may include the semiconductor memory device 100 and a controller 1100.

The semiconductor memory device 100 may include the semiconductor memory device described with reference to FIG. 1. Thus, the overlapped description thereof will be omitted.

The controller 1100 may be coupled to a host and the semiconductor memory device 100. The controller 1100 may access the semiconductor memory device 100 in response to requests of the host. For example, the controller 1100 may control a read operation, a program operation, an erase operation, and/or a background operation of the semiconductor memory device 100. The controller 1100 may provide an interface between the semiconductor memory device 100 and the host. The controller 1100 may be configured to drive firmware for controlling the semiconductor memory device 100.

The controller 1100 may include elements such as a random access memory (RAM) 1110, a processing unit 1120, a host interface 1130, and a memory interface 1140. The RAM 1100 may be used as at least one of the operation memories of the processing unit 1120, a cache memory between the semiconductor memory device 100 and the host, and/or a buffer memory between the semiconductor memory device 100 and the host. The processing unit 1120 may control operations of the controller 1100. In addition, the controller 1100 may temporarily store program data provided from the host.

The host interface 1130 may include a protocol for exchanging data between the host and the controller 1100. For example, the controller 1100 may communicate with the host through at least one of various protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, etc.

The memory interface 1140 may interface with the semiconductor memory device 100. For example, the memory interface may include a NAND flash interface or a NOR flash interface.

The memory system 1000 may further include an error correction block 1150. The error correction block 1150 may detect and correct errors in data read from the semiconductor memory device 100 by using an error correction code (ECC). For example, the error correction block 150 may be included in the controller 1100. The processing unit 1120 may control a read voltage in response to an error detection result of the error correction block 150 and control the semiconductor memory device 100 to perform a re-read operation.

The controller 1100 and the semiconductor memory device 100 may be integrated in one memory device. For example, the controller 1100 and the semiconductor memory device 100 may be integrated in a memory card such as a PC card (personal computer memory card international association (PCMCIA)), a compact flash card (CF), a smart media card (SMC), a memory stick, a multimedia card (MMC, RS-MMC or MMCmicro), an SD card (SD, miniSD, micro SD or SDHC), a universal flash storage device (UFS), etc.

For another example, the controller 1100 and the semiconductor memory device 100 may be integrated as a solid state drive (SSD). The SSD may include a storage device for storing data in a semiconductor memory. When the memory system 1000 is used as an SSD, operational rates of the host coupled to the memory system 1000 may be significantly improved.

The memory system 1000 may be used as one of several elements in various electronic devices such as a computer, an ultra mobile PC (UMPC), a workstation, a net-book, a personal digital assistant (PDA), a portable computer, a web table, a wireless phone, a mobile phone, a smart phone, an e-book, a portable multimedia player (PMP), a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, devices for home networks, devices for computer networks, devices for telematics networks, an RFID device, other devices for computing systems, etc.

The semiconductor memory device 100 or the memory system 1000 may be packaged in various forms. For example, the semiconductor memory device 100 or the memory system 1000 may be packaged by various methods such as a package on package (POP), a ball grid arrays (BGAs), a chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline integrated circuit (SOIC), a shrink small outline package (SSOP), a thin small outline package (TSOP), a thin quad flatpack (TQFP), a system in package (SIP), a multi chip package (MCP), a wafer-level fabricated package (WFP), a wafer-level processed stack package (WSP), etc.

Figure 5:
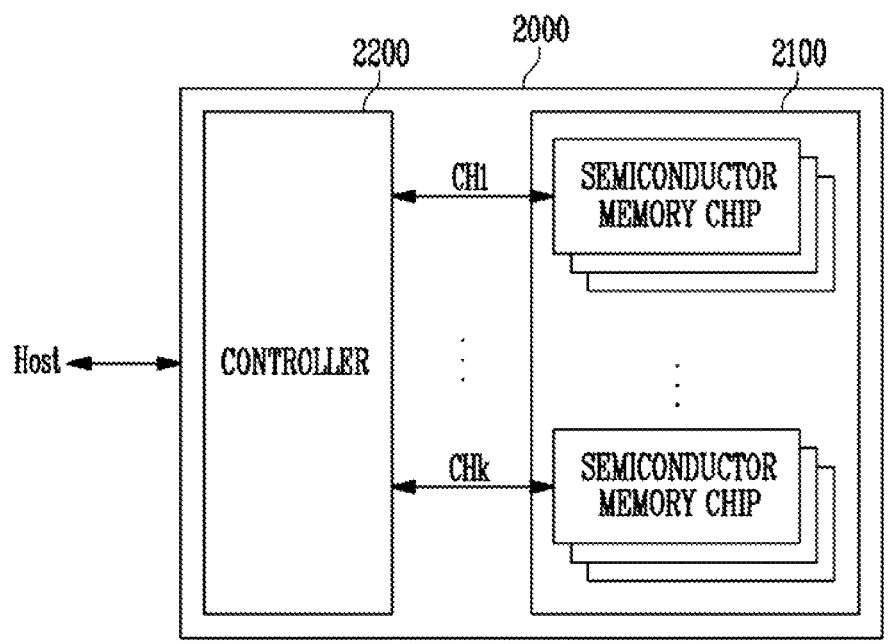
FIG. 5 is a block diagram illustrating another example of the memory system shown in FIG. 4.

FIG. 5 is a block diagram illustrating another example of the memory system shown in FIG. 4.

Referring to FIG. 5, a memory system 2000 may include a semiconductor memory device 2100 and a controller 2200. The semiconductor memory device 2100 may include semiconductor memory chips. The semiconductor memory chips may be divided into groups. Each of the groups may communicate with the controller 2200 through one common channel.

FIG. 5 shows the groups may communicate with the controller 2200 through first to k-th channels CH1-CHk. Each of the semiconductor memory chips may perform the same operation as the semiconductor memory device 100 described with reference to FIG. 4.

Each group may communicate with the controller 2200 through a single common channel. The controller 2200 may be configured in the same manner as the controller 1100 described with reference to FIG. 4 and may be configured to control the plurality of memory chips of the semiconductor memory device 2100.

Figure 6:
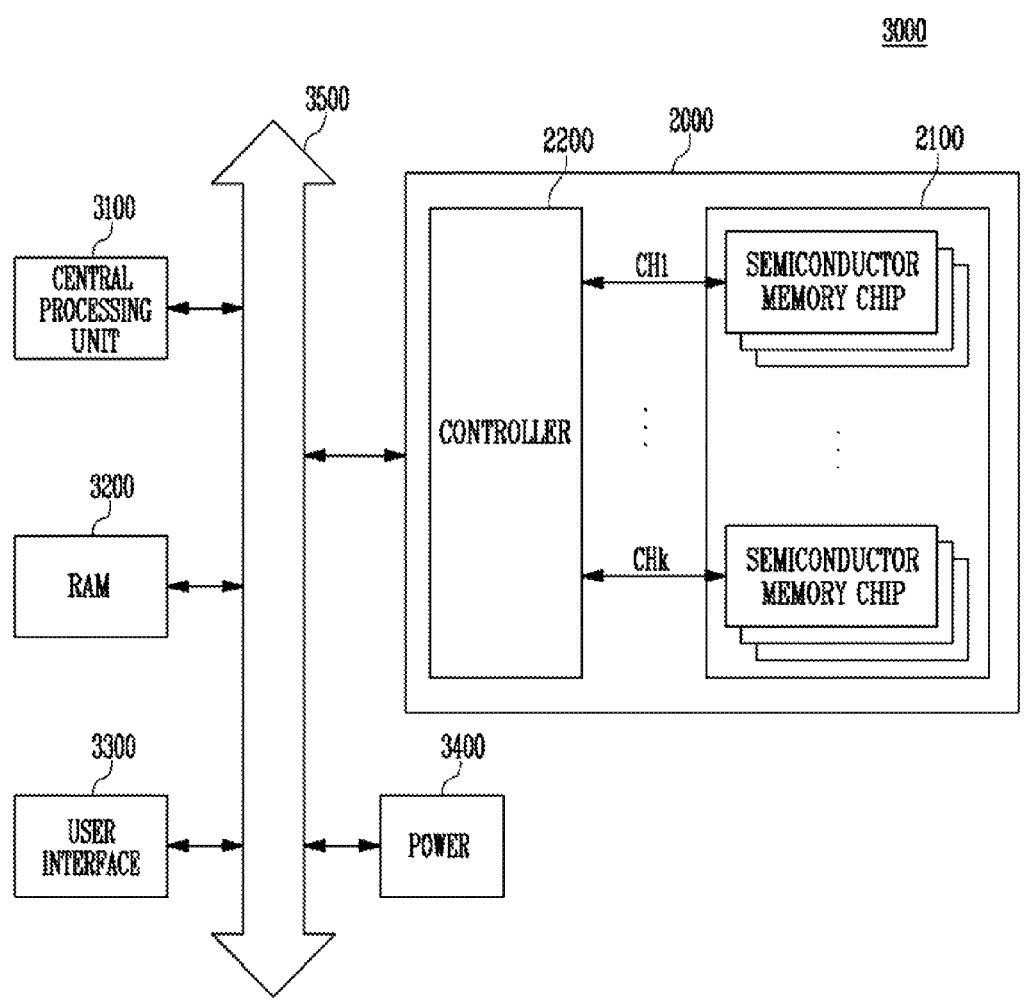
FIG. 6 is a block diagram illustrating a computing system including the memory system described with reference to FIG. 5.

FIG. 6 is a block diagram illustrating a computing system 3000 having the memory system described above with reference to FIG. 5.

Referring to FIG. 6, the computing system 3000 may include a central processing unit 3100, a random access memory (RAM) 3200, a user interface 3300, an electric source (POWER) 3400, a system bus 3500, and a memory system 2000.

The memory system 2000 may be electrically connected to the central processing unit 3100, the RAM 3200, the user interface 3300 and the electric source 3400 through the system bus 3500. Data provided trough the user interface 3300 or processed by the central processing unit 3100 may be stored in the memory system 2000.

In FIG. 6, the semiconductor memory device 2100 may be coupled to the system bus 3500 through the controller 2200. In some embodiments, the semiconductor memory device 2100 may be directly coupled to the system bus 3500. The central processing unit 3100 and the RAM 3200 may perform functions of the controller 2200.

As illustrated in FIG. 6, the memory system 2000 in FIG. 5 may be included in the memory system 3000. However, in some embodiments, the memory system 2000 may be replaced with the memory system 1000 shown in FIG. 4. In some embodiments, the computing system 3000 may include both the memory system 1000 and 2000 described above with reference to FIGS. 4 and 5.

According to an embodiment of the present invention, when a gate electrode of a semiconductor memory device having a three-dimensional structure is formed, a conductive layer may be deposited after a deposition suppressing layer is deposited in the mouth of a trench on which the gate electrode is formed, so that an overhang may be prevented from being formed at the trench, and the gate electrode may be formed without a void. Accordingly, electrical characteristics of the semiconductor device may be improved.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:
1. A semiconductor memory device, comprising:
  insulating patterns and conductive patterns stacked alternately with each other;
  penetrating structures passing through the insulating patterns and the conductive patterns; and deposition suppressing layers formed on first end portions of respective interfaces between the insulating patterns and the conductive patterns, respectively, the deposition suppressing layers being spaced from the penetrating structures, wherein the deposition suppressing layers are vertically separated from each other, and wherein the conductive patterns are extended between the deposition suppressing layers and the penetrating structures.

2. The semiconductor memory device of claim 1, further comprising:
a slit formed between the penetrating structures by etching the insulating patterns.

3. The semiconductor memory device of claim 2, wherein the deposition suppressing layers surround end portions of the insulating patterns exposed through the slit.

4. The semiconductor memory device of claim 3, wherein the deposition suppressing layers suppress deposition of the conductive patterns and prevent overhangs from being formed at the end portions of the insulating patterns.

5. The semiconductor memory device of claim 1, further comprising:
a barrier layer formed on surfaces of the insulating patterns between the insulating patterns and the deposition suppressing layers.

6. The semiconductor memory device of claim 1, further comprising:
a nucleation seed layer formed on surfaces of the insulating patterns between the insulating patterns and the deposition suppressing layers.

7. The semiconductor memory device of claim 1, wherein each of the penetrating structures includes:
a channel layer passing through the insulating patterns and the conductive patterns;
a tunnel insulating layer surrounding a sidewall of the channel layer; and
a charge storage layer surrounding the tunnel insulating layer.

8. The semiconductor memory device of claim 1, wherein the deposition suppressing layers include a nitride or an oxide.

9. The semiconductor memory device of claim 1, wherein the conductive patterns include tungsten.

10. The semiconductor memory device of claim 1, wherein second end portions of the respective interfaces between the insulating patterns and the conductive patterns are adjacent to the penetrating structures, and
wherein the first end portions and the second end portions are opposite to each other.

11. A semiconductor memory device, comprising;
insulating patterns and conductive patterns stacked alternately with each other;
penetrating structures passing through the insulating patterns and the conductive patterns;
a slit formed by etching the insulating patterns between the penetrating structures; and
deposition suppressing layers surrounding first end portions of the insulating patterns, respectively, the deposition suppressing layers being spaced from the penetrating structures, the first end portions being more adjacent to the slit than second end portions of the insulating patterns,
wherein the deposition suppressing layers are vertically separated from each other and
wherein the conductive patterns are extended between the deposition suppressing layers and the penetrating structures.

12. The semiconductor memory device of claim 11, wherein the second end portions opposite to the first end portions are in contact with the penetrating structures.

13. The semiconductor memory device of claim 1, further comprising:
a blocking insulating layer being formed between the deposition suppressing layers and the insulating patterns, the blocking insulating layer being formed along the respective interfaces between the insulating patterns and the conductive patterns.

14. The semiconductor memory device of claim 11, further comprising:
a blocking insulating layer being formed between the deposition suppressing layers and the insulating patterns, the blocking insulating layer being formed along respective interfaces between the insulating patterns and the conductive patterns.

* * * * *